(12) United States Patent
Peng

(10) Patent No.: US 8,124,988 B2
(45) Date of Patent: Feb. 28, 2012

(54) LIGHT EMITTING DIODE LAMP PACKAGE STRUCTURE AND ASSEMBLY THEREOF

(75) Inventor: Jacky Peng, Taipei County (TW)

(73) Assignee: Semisilicon Technology Corp., Jhonghe, Taipei County (TW)

( * ) Notice: Subject to any disclaimer, the term of this patent is extended or adjusted under 35 U.S.C. 154(b) by 159 days.

(21) Appl. No.: 12/153,910

(22) Filed: May 28, 2008

(65) Prior Publication Data

US 2009/0294782 A1    Dec. 3, 2009

(51) Int. Cl.
*H01L 33/48* (2010.01)
(52) U.S. Cl. .............. 257/88; 257/89; 257/433
(58) Field of Classification Search ............ 257/88, 257/89, 433
See application file for complete search history.

(56) References Cited

U.S. PATENT DOCUMENTS

| | | | |
|---|---|---|---|
| 7,473,933 B2 * | 1/2009 | Yan | 257/88 |
| 7,717,596 B1 * | 5/2010 | Bell | 362/494 |
| 2008/0087903 A1 * | 4/2008 | Stoyan | 257/88 |

* cited by examiner

*Primary Examiner* — Marcos D. Pizarro
*Assistant Examiner* — Tifney Skyles
(74) *Attorney, Agent, or Firm* — Bacon & Thomas, PLLC

(57) ABSTRACT

The present invention provides a light emitting diode (LED) lamp package structure characterized in which a plurality of light emitting diodes, a control integrated circuit, a circuit board and four electric conductivity supports are encapsulated inside a package body where the electric conductivity supports are respectively a Vdd pad, a data input pad, a data output pad, and a Vss pad. The present invention further provides a LED lamp assembly, comprising a LED lamp, a lampshade, a socket, and a mount formed with a socket. After the LED lamp is mounted on the socket with the four electric conductivity supports exposed and the socket is plugged into the socket of the mount, the electric conductivity supports would contact the four electrode contacts in the socket where the four electrode contacts are respectively a positive DC voltage electrode, a data input electrode, a data output electrode and a negative DC voltage electrode.

24 Claims, 14 Drawing Sheets

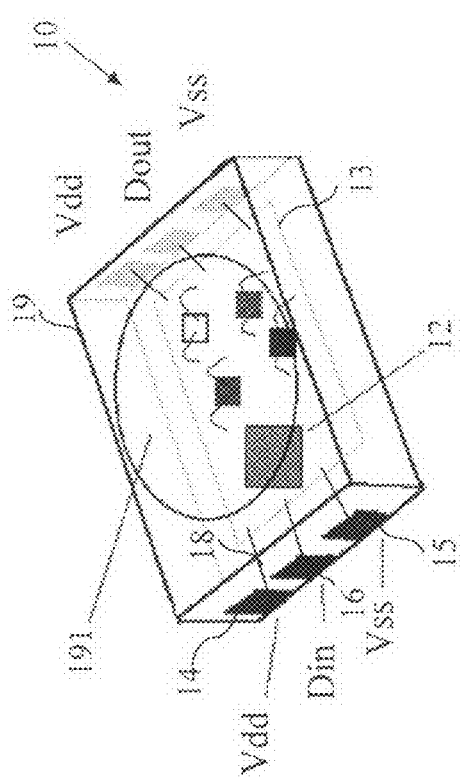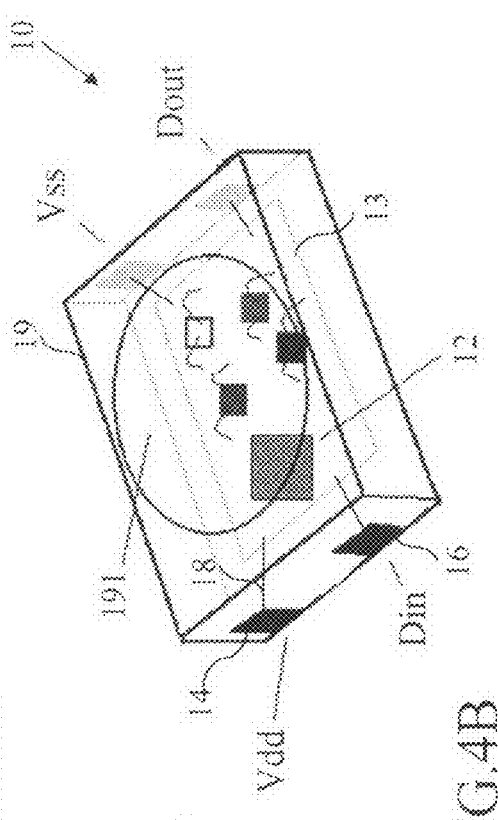
FIG.4A
FIG.4B

US 8,124,988 B2

LIGHT EMITTING DIODE LAMP PACKAGE STRUCTURE AND ASSEMBLY THEREOF

BACKGROUND OF THE INVENTION

1. Field of the Invention

The present invention discloses a light emitting diode (LED) lamp package structure and assembly thereof, more particularly a LED lamp package with light emitting diodes, control integrated circuit (IC) and circuit board encapsulated inside a package body.

2. Description of Related Art

According to the prior art, a light emitting diode (LED) lamp package typically contains a LED chip and two electric conductivity supports. The two electric conductivity supports have a portion each exposed outside the package and are electrically connected to the anode and cathode of the LED chip respectively. This type of LED lamp relies on the two electric conductivity supports for receiving external voltage signal and uses the voltage signal to control its luminosity or flashing pattern.

In another prior art, the LED package encapsulates simultaneously red, blue and green LED chips and four electric conductivity supports. The four electric conductivity supports have a portion each exposed outside the package. One of the electric conductivity supports serves as a common electrode end for the red, blue and green LED chips, while the other three electric conductivity supports are respectively electrically chips, while the other three electric conductivity supports are respectively electrically connected to the other electrode of the red, blue and green LED chips inside the package. This type of LED lamp relies on three electric conductivity supports for receiving external voltage signals corresponding to the red, blue and green LED chips and uses those voltage signals to control its luminosity or flashing pattern.

The LED lamp of prior art described above controls its luminosity or flashing through the external voltage signals received by electric conductivity supports, whereas the LED lamp itself does not any autonomous control. In the case of a lamp string comprised of a plurality of interconnected LED lamps, the lamp string controls the luminosity or the flashing pattern of the LED lamps via a controller. As the number of LED lamps in the lamp string increases, the design of such controller becomes more complicated. In addition, LED lamps of prior art do not include a control circuit such that its encapsulated electric conductivity supports lack data input and output pins to exert diverse controls over its luminosity and flashing in a manner similar to data control.

SUMMARY OF THE INVENTION

In view that LED lamps of prior art lack data input and output pins and that the layout and control of the lamp-string circuit are confined by the number of LED lamps in the string, the present invention provides a LED lamp package structure having data input and output pins, and a LED lamp assembly suitable for wiring layout and installation.

An object of the present invention is to provide a LED lamp package having data input and output pins.

Another object of the present invention is to provide a LED lamp assembly that facilitates the mount/dismount of LED lamps and the wiring layout of LED lamp string.

To achieve the aforesaid objects, the LED lamp package of the invention comprises a plurality of light emitting diodes (LEDs), each LED having two electrode ends and one of the electrode ends of each LED being a common electrode end; a control light emitting diode (IC) having a data input electrode and a data output electrode, and electrically connected to the LEDs to control the luminous state of each LED; a circuit board for carrying the LEDs and the control IC; a first electric conductivity support, a second electric conductivity support, a third electric conductivity support and a fourth electric conductivity support, each being electrically connected to the circuit board, the first electric conductivity support being a positive DC voltage pad (Vdd), the second electric conductivity support being connected to the data input electrode, the third electric conductivity support being connected to the data output electrode, the fourth electric conductivity support being a negative DC voltage pad (Vss); and a package body encapsulating the LEDs, the control IC and the circuit board while the first electric conductivity support, the second electric conductivity support, the third electric conductivity support and the fourth electric conductivity support being exposed outside the package body.

The common electrode end is a Vdd pad or a Vss pad.

The LEDs and the control IC are mounted on the same surface of the circuit board or the control IC is mounted on the other surface of the circuit board.

The first electric conductivity support and the fourth electric conductivity support are connected to two opposing sides or the same side of the package body, and the second electric conductivity support and the third electric conductivity support are connected to two opposing sides of the package body.

The LED lamp package structure further contains a fifth electric conductivity support and a sixth electric conductivity support, the fifth electric conductivity support being a Vdd pad and the sixth electric conductivity support being a Vss pad. The first electric conductivity support and the fifth electric conductivity support are connected to two opposing sides of the package body, the second electric conductivity support and the third electric conductivity support are connected to two opposing sides of the package body, while the fourth electric conductivity support and the sixth electric conductivity support are connected to two opposing sides of the package body.

The two opposing surfaces of the circuit board each carries a red LED, a green LED and a blue LED.

The package body is an injection-molded transparent glue in spherical or semi-spherical shape.

The package body is in rectangular shape having a light emitting window, the LEDs aligning with the light emitting window inside the rectangle.

To achieve the aforesaid objects, the LED lamp assembly provided by the invention comprises a LED lamp having a package body encapsulating a plurality of LEDs and four electric conductivity supports; a lampshade covering the package body of the LED lamp; a socket being a body having a perforation and extended with a plug-in member, the perforation accommodating the LED lamp and enabling the four electric conductivity supports to expose outside the body; and a mount formed with a socket, the socket having four electrode contacts inside such that when the socket is plugged into the socket, the four electrode contacts are respectively in contact with the four electric conductivity supports.

The plurality of LEDs are mounted on a circuit board. The circuit board also carries a control IC. The four electric conductivity supports are respectively a Vdd pad, a data input pad, a data output pad and a Vss pad.

The four electric conductivity supports have a flat shape and are flexible.

The upper half of the socket accommodates the body of the socket, and the lower half of the socket is coupled to the plug-in member of the socket.

The socket forms a through-hole. The four electrode contacts pass through the through-hole to connect to four electrical wires outside respectively.

To achieve the aforesaid objects, the present invention further provides a LED lamp assembly, comprising a LED lamp consisting of a package body and a circuit board, the package body encapsulating a plurality of LEDs and four electric conductivity supports, the four electric conductivity support being electrically connected to the circuit board, and the circuit board carrying a control IC and forming a positive DC voltage electrode, a data input electrode, a data output electrode and a negative DC voltage electrode; a lampshade covering the package body of the LED lamp; and a mount formed with a socket, the socket having four electrical contacts inside such that when the circuit board of the LED lamp is inserted into the socket, the four electrode contacts are respectively in contact with the positive DC voltage electrode, the data input electrode, the data output electrode and the negative DC voltage electrode.

BRIEF DESCRIPTION OF THE DRAWINGS

FIG. 4A and FIG. 4B are structural views of the interior of a LED lamp according to a second embodiment of the invention, wherein the package body has respectively six electrode contacts and four electrode contacts.

DETAILED DESCRIPTION OF THE INVENTION

The technical contents, features and effects of the invention are described in detail below with embodiments in reference to the accompanying drawings.

Figure 1:
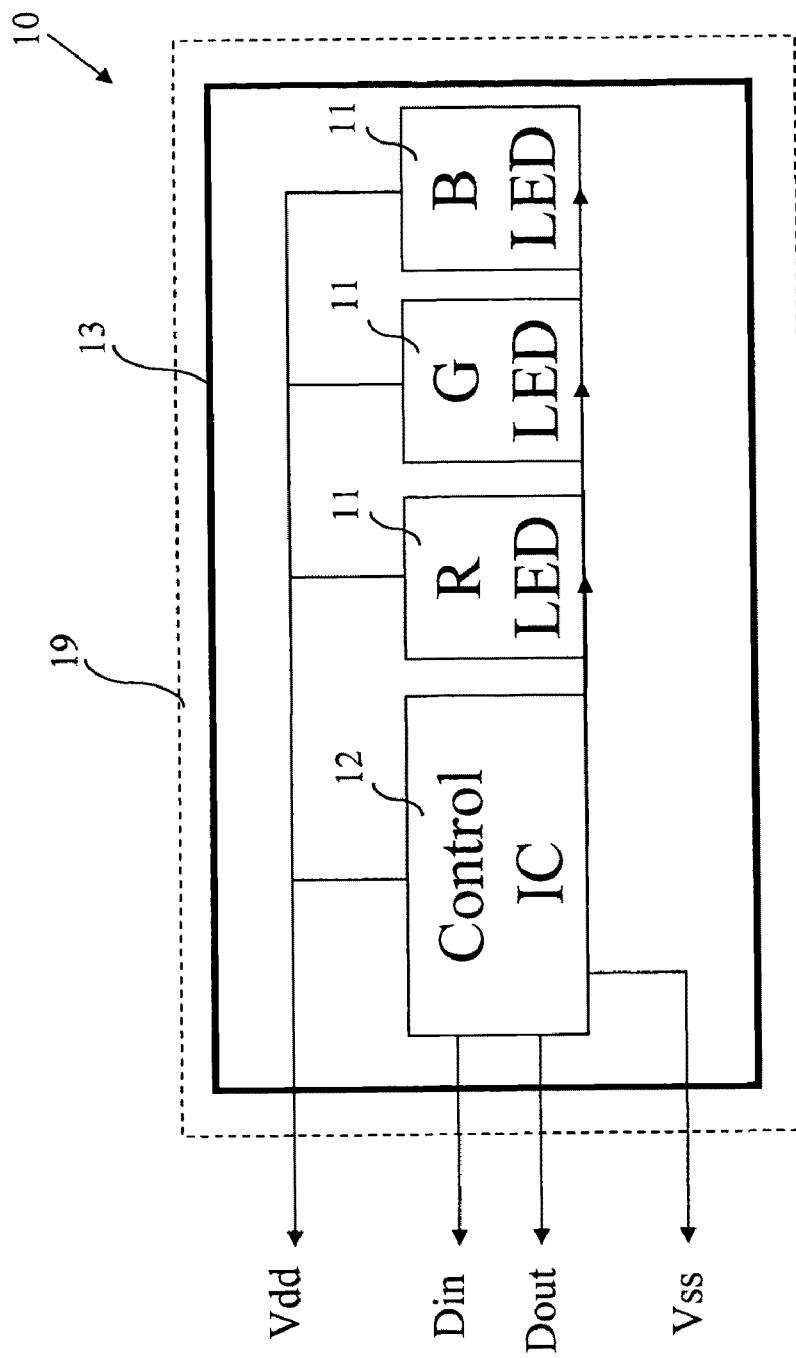
FIG. 1 is the circuit block diagram of a LED lamp according to the invention.

FIG. 1 shows the circuit block diagram of a LED lamp according to the invention. According to a preferred embodiment of the invention, the LED lamp 10 comprises a red light emitting diode (R LED) 11, a blue light emitting diode (B LED) 11 and a green light emitting diode (G LED) 11, and a control integrated circuit (IC) 12, the components being mounted on a circuit board 13. The wiring layout of the circuit board 13 enables the control IC 12 to electrically connect the red, blue and green LEDs 11 respectively. The red, blue and green LEDs 11 have a common electrode end, the common electrode end being a Vdd pad. In a different embodiment of the invention, the LED lamp 10 comprises a red light emitting diode (R LED) 11, a blue light emitting diode (B LED) 11, a green light emitting diode (G LED) 11 and a white light emitting diode (W LED) mounted on the same side surface of the circuit board 13; the common electrode end can also be a Vss pad.

The LED lamp 10 has a data input pin Din and a data output pin Dout. The control IC 12 receives external control data via the Din, and controls the luminosity or flashing of LED 11 according to said control data, and outputs the control data via the Dout. In addition, the LED lamp 10 has power supply pins Vdd and Vss to receive a DC voltage.

According to a preferred embodiment of the invention, the LED lamp 10 has a package body 19 to encapsulate the circuit board 13 mounted with a plurality of LEDs 11 and a control IC 12 and four electric conductivity supports, the four electric conductivity supports being respectively a Vdd end, a Din end, a Dout end and a Vss end, a portion of the four electric conductivity supports being exposed outside the package body 19, and the four electric conductivity supports being electrically connected to the circuit board 13 inside the package body 19.

Figure 2A:
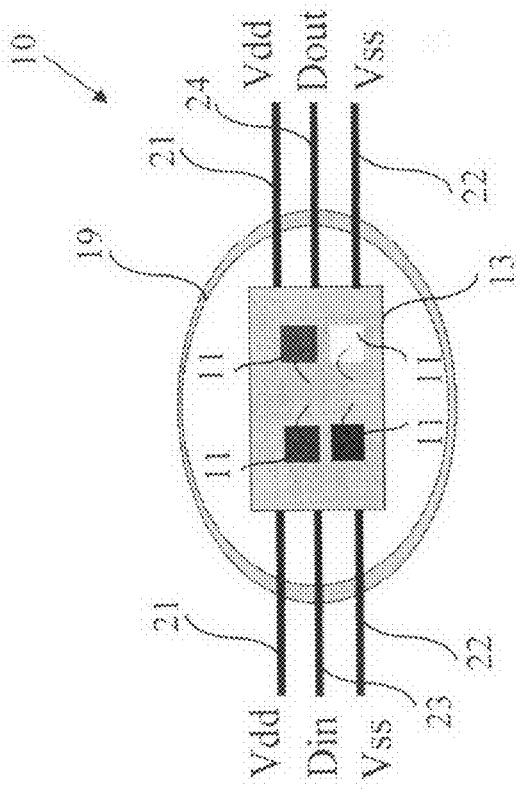
FIG. 2A is a top view of the interior of a LED lamp according to a first embodiment of the invention.
Figure 2B:
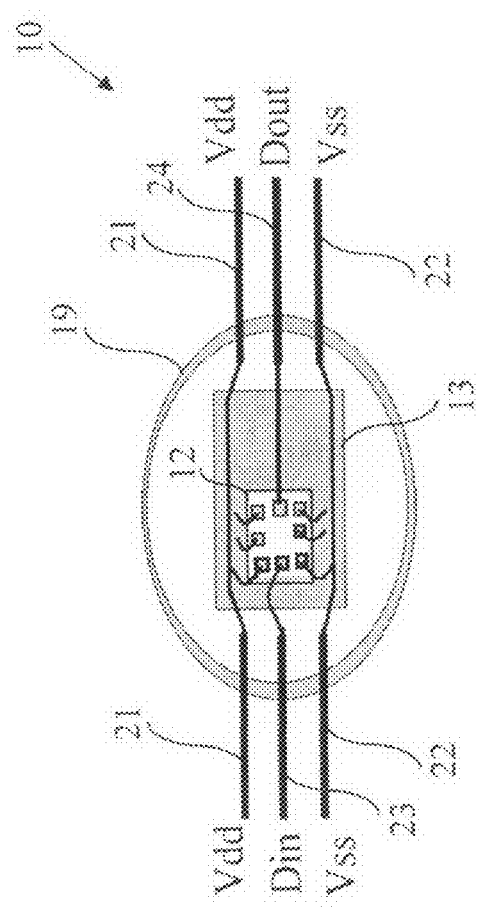
FIG. 2B is a bottom view of the interior of a LED lamp according to a first embodiment of the invention.
Figure 3A:
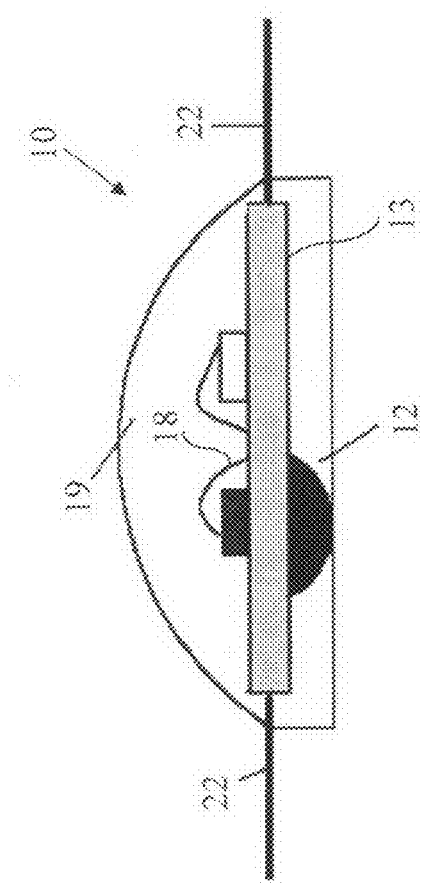
FIG. 3A and FIG. 3B are side views of the interior of a LED lamp according to a first embodiment of the invention, where the package body is in hemispherical shape and spherical shape respectively.
Figure 3B:
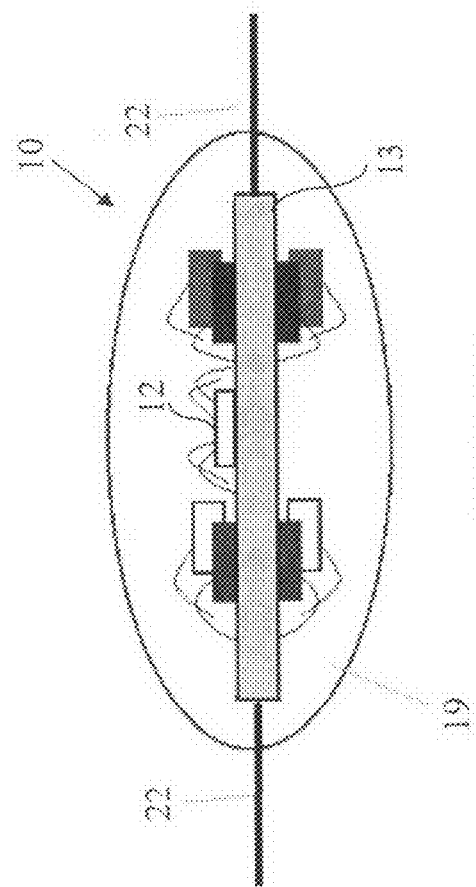

Referring to FIG. 2A and FIG. 2B which are respectively a top view and a bottom view of the interior of the LED lamp according to a first embodiment of the invention, the first embodiment is a first package structure implemented based on the LED lamp 10 shown in FIG. 1, where one side of the circuit board 13 carries four LEDs 11, which are respectively R LED, B LED, G LED and W LED, while the other side of the circuit board 13 carries a control IC 12. The circuit board 13 is encapsulated in a package body 19 to form a LED lamp 10. The package body 19 is preferably transparent glue having a hemispherical shape as shown in FIG. 3A or a spherical shape as shown in FIG. 3B. The package body 19 can also have a shell body to enclose the circuit board 13 mounted with the plurality of LEDs 11 and the control IC 12. In addition, as in the embodiment shown in FIG. 3B, both sides of the circuit board 13 carry R LED, B LED, G LED and W LED 11 simultaneously such that the entire sphere of the package body 19 illuminates uniformly.

Again referring to FIG. 2A and FIG. 2B, in a first embodiment of the invention, the LED lamp 10 contains six electric conductivity supports exposed outside the package body 19 with three electric conductivity supports each being disposed at two opposing sides of the circuit board 13, wherein the Din electric conductivity support and the Dout electric conductivity support are respectively disposed at two opposing sides of the circuit board 13, while the Vdd ends are two electric conductivity supports disposed at two opposing sides of the circuit board 13. Similarly the Vss ends are two electric conductivity supports disposed at two opposing sides of the circuit board 13. In addition, the six electric conductivity supports can be replaced by a conductive wire to form a lamp string. The conductive wire is soldered to the circuit board 13 and encapsulated inside the package body 19.

According to the first embodiment of the invention, the LED lamps 10 can also be serially connected into a lamp string. Given that the same side of the circuit board 13 has a Vdd electric conductivity support and a Vss electric conductivity support, the Vdd ends and the Vss ends of two adjacent LED lamps 10 can be directly electrically connected. As the Din electric conductivity support and the Dout electric conductivity support are respectively disposed at two opposing sides of the circuit board 13, the Din of a LED lamp 10 can be directly electrically connected to the Dout of the previous-level LED lamp 10, while its Dout can be directly electrically connected to the Din of the next-level LED lamp 10.

According to the first embodiment the LED lamp 10 of the invention, the spherical or hemispherical package structure makes it easier for the lamp string to lay down straight or hang down naturally. The electric conductivity supports at power supply end and the electric conductivity supports at data input and output ends are parallelly arranged such that in serial connection, the LED lamps 10 would not protrude because of the wiring, but are arranged evenly. The illumination of the lamp string can also be single-sided or double-sided as shown in FIG. 3A and FIG. 3B. Such lamp string can be used in ornaments that prefer a flat shape, such as a lamp screen.

Referring to FIG. 4A and FIG. 4 B which are structural views of the interior of a LED lamp 10 according to a second embodiment of the invention, wherein the package body 19 has respectively six electrode contacts and four electrode contacts. The second embodiment is a second package structure implemented based on the LED lamp 10 shown in FIG. 1. In comparison with the first embodiment, the second package body 19 of the second package structure has a rectangular shape that conforms to 5050 or 3528 package specifications and has a light emitting window 191. The LEDs 11 inside the package body 19 aligns with the light emitting window 191.

In the second embodiment, the rectangular package body 19 has six electrodes disposed at two opposing sides or four electrodes disposed at two opposing sides. Inside the package body 19, the circuit board 13 is electrically connected with the electrodes 14, 15, 16, 17 via conductive metal wire 18. As in the package body 19 shown in FIG. 4A, the Din and Dout electrodes 16, 17 are respectively disposed at two opposing sides of the package body 19, while Vdd has two electrodes 14 respectively disposed at two opposing sides of the package body 19. Similarly, Vss also has two electrodes 15 respectively disposed at two opposing sides of the package body 19. As in the package body 19 shown in FIG. 4B, the Din and Dout electrodes 16, 17 are respectively disposed at two opposing sides of the package body 19, while Vdd electrode 14 and Vss electrode 15 are respectively disposed at two opposing sides of the package body 19.

According to the LED lamp 10 in the second embodiment, the package body 19 has on right side and left side each three electrode contacts that is suitable for use in printed circuit board (PCB) or light bar that requires SMD solder. The LED lamp 10 in the second embodiment with light dissipating from the top center transparent light emitting window is suitable for light bars surrounding a sign board or a place with limited space that requires decoration. In light that the control IC is encapsulated in the package body 19, the LED lamps 10 can be interconnected in series or in parallel for the lamp string to work.

Figure 5:
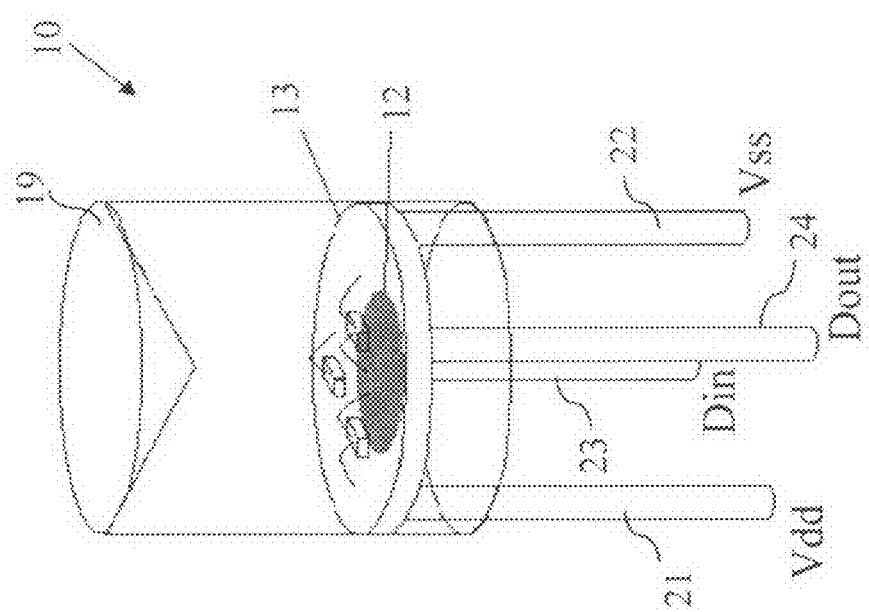
FIG. 5 is a perspective view of the interior of a LED lamp according to a third embodiment of the invention.

FIG. 5 is a perspective view of the interior of a LED lamp according to a third embodiment of the invention. The third embodiment is a third package structure implemented based on the LED lamp 10 shown in FIG. 1. In comparison with the first and the second embodiments, the package body 19 of the third package structure has a cylindrical shape with four electric conductivity supports 21, 22, 23, 24 exposed from the bottom of the cylindrical package. Inside the package body 19, the plurality of LEDs 11 are disposed on the top surface of the circuit board 13 to emit light upward, while the control IC 12 is disposed on the other side of the circuit board 13.

The LED lamp 10 in the third embodiment is the most commonly applied style and more readily accepted by the public. It is suitable for applications in electronic screen and TV wall.

Figure 6A:
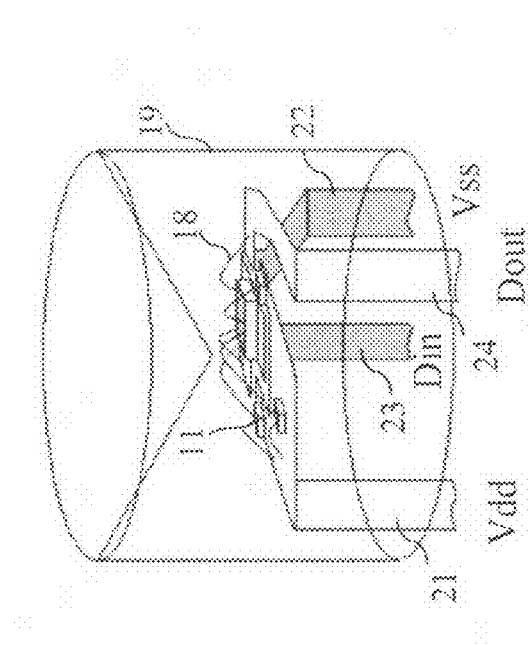
FIG. 6A and FIG. 6B are another perspective views of a LED according to a third embodiment of the invention, wherein the four electric conductivity supports are distributed at four corners.
Figure 6B:
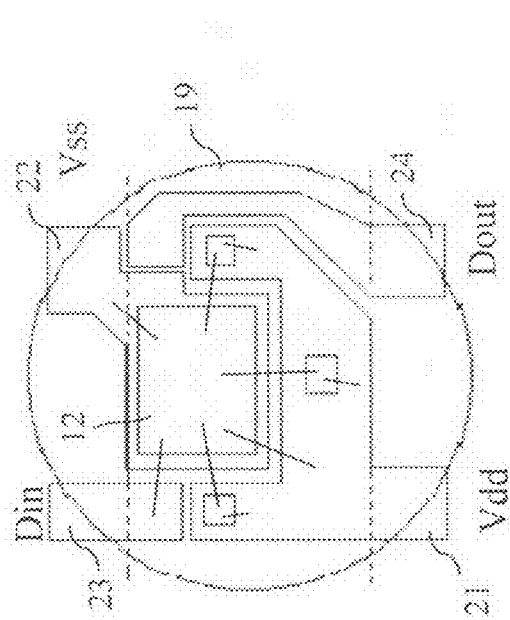

FIG. 6A and FIG. 6B are another perspective views of a LED according to a third embodiment of the invention, wherein the four electric conductivity supports are distributed at four corners. In this embodiment, the LED lamp 10 contains a plurality of LEDs 11, a control IC 12 and four electric conductivity supports 21, 22, 23, 24 encapsulated in the package body 19 with the four electric conductivity supports 21, 22, 23, 24 exposed from the bottom of the package body 19, wherein the plurality of LEDs 11 and the control IC 12 are mounted at one end of the electric conductivity supports. FIG. 6B is top view clearly illustrating the interior layout of the package body 19. Electric conductivity support 21 is the common electrode end of the plurality of LEDs 11, i.e. a Vdd electrode. Inside the package body 19, one end of electric conductivity support 21 forms a platform for carrying the plurality of LEDs 11, while one end of electric conductivity support 22 also forms a platform for carrying the control IC, and conductive metal wires 18 are used to achieve electrical connection between the components without relying on a circuit board 13 to carry the plurality of LEDs 11 and control IC 12.

Figure 7:
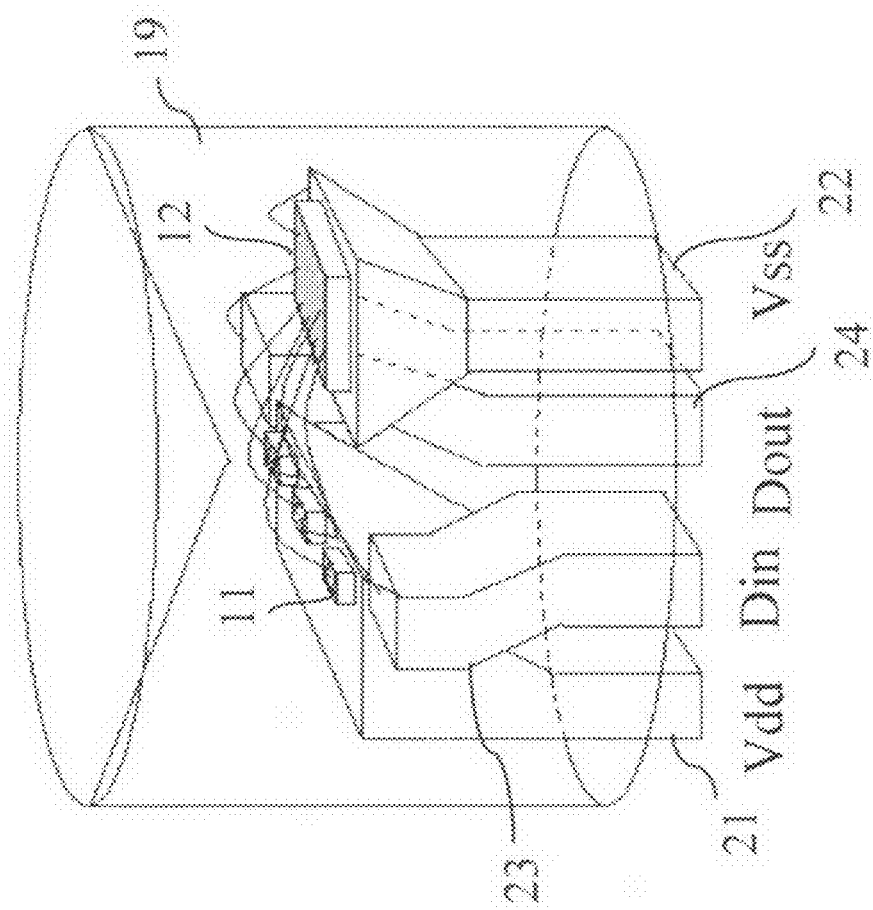
FIG. 7 is yet another perspective view of the interior of a LED lamp according to a third embodiment of the invention, wherein the four electric conductivity supports are linearly arranged.

FIG. 7 is yet another perspective view of the interior of a LED lamp according to a third embodiment of the invention, wherein the four electric conductivity supports are linearly arranged. The embodiments shown in FIG. 7 and FIG. 6A differ only in the layout of electric conductivity supports 21, 22, 23, 24. In FIG. 7, the four electric conductivity supports 21, 22, 23, 24 are linearly arranged.

Figure 8:
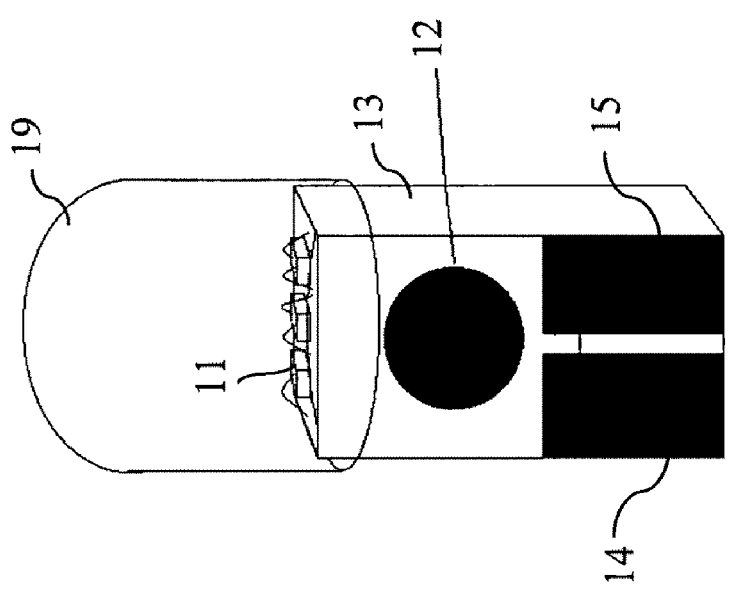
FIG. 8 is yet another perspective view of the interior of a LED lamp according to a third embodiment of the invention, wherein the LEDs and a part of circuit board encapsulated inside the package body.

FIG. 8 is yet another perspective view of the interior of a LED lamp according to a third embodiment of the invention, the figure in this embodiment, the LED lamp 10 encapsulated inside a plurality of the LED 11 and a part of the circuit board 13 being inside said package body. However, a plurality of the LED 11 is mounted a platform of the circuit board 13 being inside said package body, and complete electrical connection from the conductive metal wires 18. Beside, an IC 12 is mounted on a part of the circuit broad, and a part of the circuit board 13 being outside said package body formed with a positive DC voltage pad 14, a data input pad 16 (the picture doesn't shown), a data output pad 17 (the picture doesn't shown), and a negative DC voltage pad 15. Said circuit board 13 has wiring to be electrically connected to the control circuit 12, the electrode 14, 15, 16, 17 and the LED. Therefore, the embodiment does not mount a plurality of LED 11 by electric conduction support.

Figure 9:
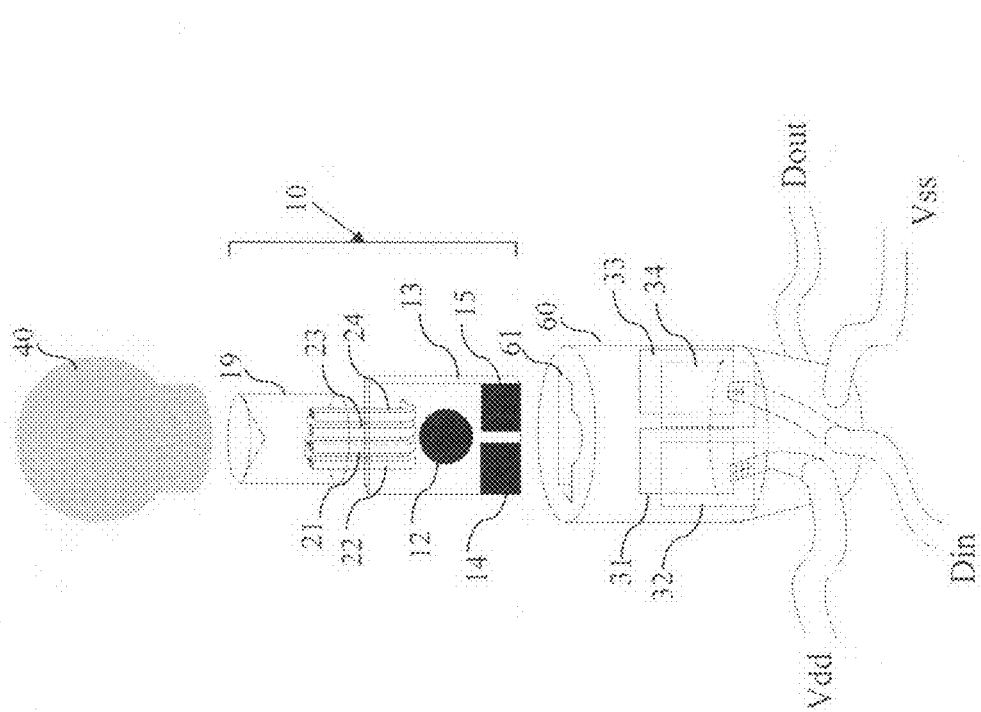
FIG. 9 is an exploded view of a LED lamp assembly according to a fourth embodiment of the invention.

FIG. 9 is an exploded view of a LED lamp assembly according to a fourth embodiment of the invention. The LED lamp assembly in the fourth embodiment comprises: a LED lamp 10, a lampshade 40 and a mount 60. The LED lamp 10 contains a package body 19 and a circuit board 13. The lampshade 40 covers the package body 19 of LED lamp 10. The package body 19 encapsulates tri-color LED 11 and four electric conductivity supports 21, 22, 23, 24. The four electric conductivity supports 21, 22, 23, 24 are electrically connected to the circuit board 13. The circuit board 13 carries a control IC 12 and forms a positive DC voltage electrode 14, a data input electrode 16, a data output electrode 17 and a negative DC voltage electrode 15.

Figure 10:
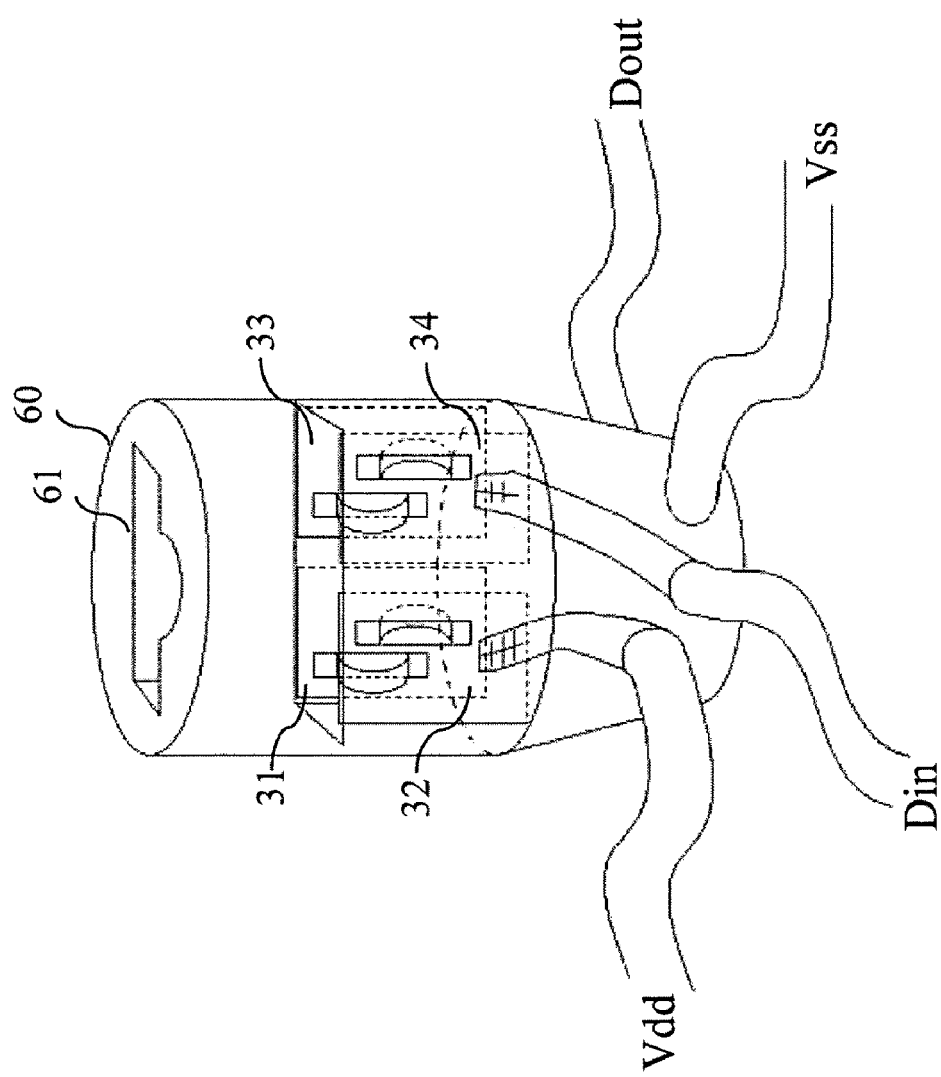
FIG. 10 is a perspective view of the mount in the fourth embodiment of the invention.

The mount 60 of the LED lamp assembly forms a socket 61, the socket 61 having four electrode contacts 31, 32, 33, 34 therein. When the circuit board 13 of the LED lamp 10 is inserted into the socket 61, the four electrode contacts 31, 32, 33, 34 are in contact respectively with the Vdd end, Din end, Dout end and Vss end of electric conductivity supports. In addition, to increase the contact area between the four electrode contacts 31, 32, 33, 32 and electrodes 14, 15, 16, 17 of circuit board 13, the contact surface of electrode contacts 31, 32, 33, 34 can have an arc surface as shown in FIG. 10.

According to the LED lamp assembly in the fourth embodiment, a lamp string can form a connection structure with a plurality of mounts 60 where each mount 60 can be easily coupled with the LED lamp 10 and its lampshade 40. If a LED lamp 10 is damaged, the service personnel can replace the LED lamp 10 on the mount 60 without dismantling the connection structure of the lamp string.

Figure 11:
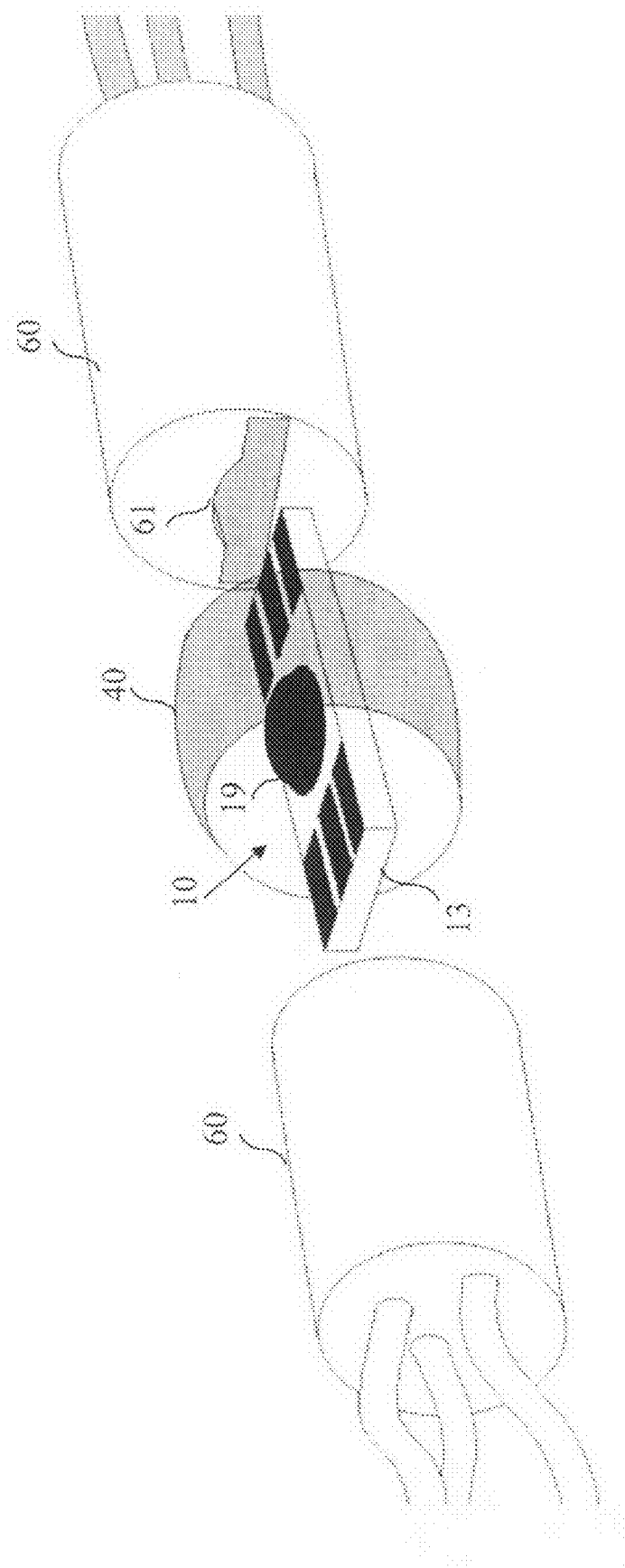
FIG. 11 is an exploded view of a LED lamp assembly according to a fifth embodiment of the invention.

FIG. 11 is an exploded view of a LED lamp assembly according to a fifth embodiment of the invention. In the fifth embodiment, a LED lamp assembly is conveniently implemented in a lamp string wherein the LED lamp 10 contains a circuit board 13. The circuit board 13 has electrodes arranged on two opposing sides, wherein the center electrodes on two sides are respectively Din end and Dout end, while the electrodes on either side of the Din end correspond to the electrodes on either side of the Dout end, which are respectively Vdd end and Vss end. At the center of the circuit board 13, a transparent glue encapsulates a plurality of LEDs and a control IC. The two electrode-mounted sides of the circuit board 13 can be inserted into the socket 61 of mount 60 respectively where the wiring of the mount 60 provides the electrical connection of the lamp string. In addition, there is provided a lampshade 40 between the two mounts 60 to accommodate the LED lamp 10.

Figure 12:
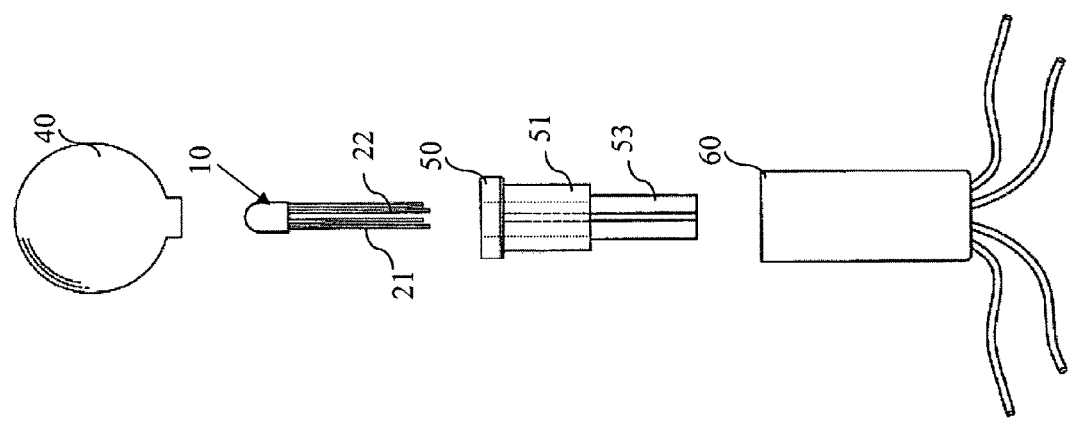
FIG. 12 is an exploded view of a LED lamp assembly according to a sixth embodiment of the invention.
Figure 14:
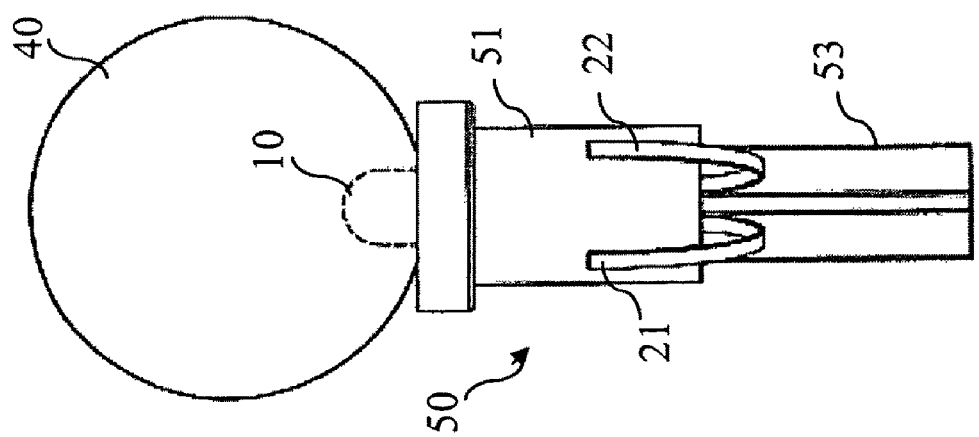
FIG. 14 is a side view of the lampshade, LED lamp and socket in the sixth embodiment of the invention.

FIG. 12 is an exploded view of a LED lamp assembly according to a sixth embodiment of the invention. In the sixth embodiment, a LED lamp assembly comprises: a lampshade 40, a LED lamp 10, a socket 50 and a mount 60. The LED lamp 10, which can be a LED lamp shown in FIG. 5 or a conventional LED lamp without a control IC, has four electric conductivity supports 21, 22, 23, 24. The LED lamp assembly is assembled by covering the package body of LED lamp 10 with the lampshade 40 then the LED lamp is mounted into the socket 50 as shown in FIG. 14. A lamp string can be fabricated by having a plurality of mounts 60 form a connection structure where each mount 60 can be easily plugged into the socket 50 as shown in FIG. 14. If a LED lamp 10 is damaged, the service personnel can replace the LED lamp 10 on the mount 60 without dismantling the connection structure of the lamp string.

Figure 13:
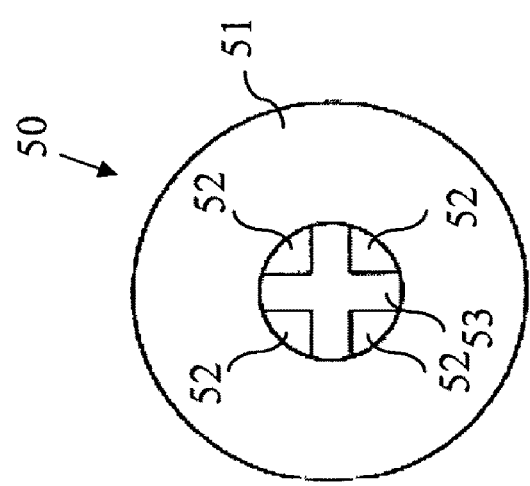
FIG. 13 is a top view of the socket in the sixth embodiment of the invention.

FIG. 13 is a top view of the socket 50 in the sixth embodiment of the invention. The socket 50 has a body 51 with a perforation 52 and a plug-in member 53 extended from the bottom of the body 51. The plug-in member 53 has a cross shape to facilitate coupling with the mount 60. The perforation 52 is divided into four small holes by the cross-shaped plug-in member 53. When the body 51 accommodates the LED lamp 10, the four electric conductivity supports 21, 22, 23, 24 align with the four small holes respectively and become exposed outside the body 51. In this embodiment, the four electric conductivity supports 21, 22, 23, 24 are flat shape and flexible. Thus the electric conductivity supports 21, 22, 23, 24 can be folded easily as shown in FIG. 14 illustrating the assembly of a lampshade 40, a LED lamp 10 and a socket 50.

Figure 15:
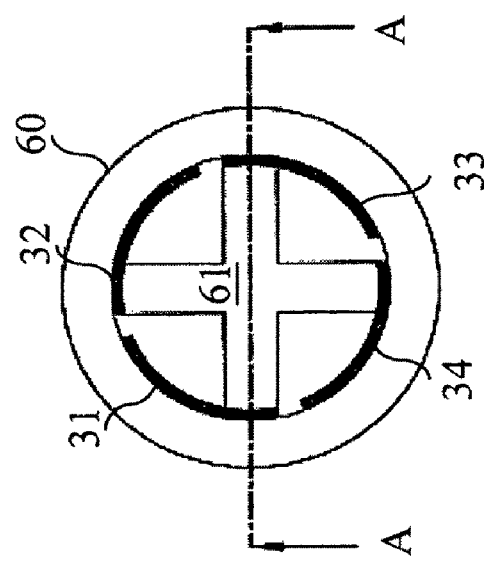
FIG. 15 is a top view of the mount in the sixth embodiment of the invention.

FIG. 15 is a top view of the mount 60 in the sixth embodiment of the invention. The mount 60 is formed with a socket 61, the socket 61 having four electrode contacts 31, 32, 33, 34 inside. When the socket 50 is plugged into the socket 61, the four electrode contacts 31, 32, 33, 34 are respectively in contact with the four electric conductivity supports 21, 22, 23, 24 of the LED lamp 10. In addition, the socket 61 has a cross-shaped slot to be coupled with the cross-shaped plug-in member 53 of the socket 50.

Figure 16:
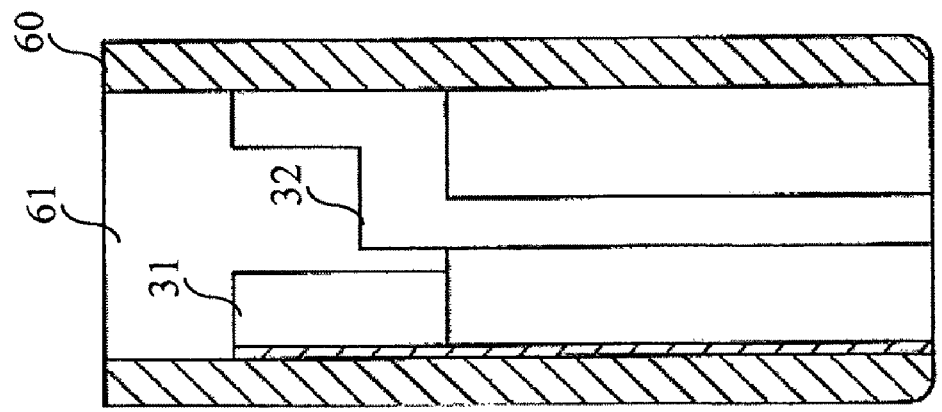
FIG. 16 is a sectional view of the mount in the sixth embodiment of the invention.

FIG. 16 is a sectional view of the mount along line A as shown in FIG. 15. FIG. 16 clearly shows that the socket 61 forms a through-hole, the upper half of the through-hole accommodating the body 51 of the socket 50, and the lower half of the through-hole forming a cross-shaped slot to couple with the plug-in member 53 of the socket 50, while the four electrode contacts 31, 32, 33, 34 inside the socket 61 are segregated by the cross-shaped slot and extended to the bottom of the mount 60 to connect externally with the wiring of lamp string.

What is claimed is:

1. A LED lamp package structure, comprising:
    a plurality of light emitting diodes, each light emitting diode having two electrode ends and one of the electrode ends being a common electrode end;
    a control integrated circuit, having a data input electrode, a data output electrode, a positive power-in electrode, and a negative power-in electrode, and electrically connected to the light emitting diodes, wherein the control integrated circuit receives external control data via the data input electrode to control the illumination state of each light emitting diode according to the external control data;
    a first conductor, a second conductor, a third conductor, and a fourth conductor, the first conductor being a positive DC voltage pad and connected to the common electrode of each light emitting diode and the positive power-in electrode of the control integrated circuit, the second conductor being connected to the data input electrode, the third conductor being connected to the data output electrode, the fourth conductor being a negative DC voltage pad and connected to the negative power-in electrode of the control integrated circuit; and
    a package body encapsulating the light emitting diodes, the control integrated circuit and the conductors, a portion of the first conductor, the second conductor, the third conductor, and the fourth conductor being exposed outside the package body.

2. The light emitting diode lamp package structure according to claim 1, wherein the common electrode end is a positive DC voltage pad or a negative DC voltage pad.

3. The light emitting diode lamp package structure according to claim 1, further comprising a circuit board carrying the light emitting diodes and the control integrated circuit.

4. The light emitting diode lamp package structure according to claim 3, wherein the light emitting diodes and the control integrated circuit are mounted on the same surface of the circuit board.

5. The light emitting diode lamp package structure according to claim 3, wherein the light emitting diodes are mounted on one surface of the circuit board and the control integrated circuit is mounted on the other surface of the circuit board.

6. The light emitting diode lamp package structure according to claim 1, wherein the conductors are an electric conductivity support or a conductive wire.

7. The light emitting diode lamp package structure according to claim 1, wherein the first conductor forms a platform inside the package body, said platform carrying the light emitting diodes, and the first conductor being electrically connected to the light emitting diodes.

8. The light emitting diode lamp package structure according to claim 1, wherein the fourth conductor forms a platform inside the package body, the platform carrying the control integrated circuit, and the fourth conductor being electrically connected to the control integrated circuit.

9. The light emitting diode lamp package structure according to claim 1, wherein the first conductor and the fourth conductor are connected to two opposing sides of the package body, and the second conductor and the third conductor are connected to two opposing sides of the package body.

10. The light emitting diode lamp package structure according to claim 1, wherein the first conductor and the fourth conductor are connected to the same side of the package body, while the second conductor and the third conductor are connected to two opposing sides of the package body.

11. The light emitting diode lamp package structure according to claim 1, further comprising a fifth conductor and a sixth conductor, the fifth conductor being a positive DC voltage pad and the sixth conductor being a negative DC voltage pad.

12. The light emitting diode lamp package structure according to claim 11, wherein the first conductor and the fifth conductor are connected to two opposing sides of the package body, the second conductor and the third conductor are connected to two opposing sides of the package body, while the fourth conductor and the sixth conductor are connected to two opposing sides of the package body.

13. The light emitting diode lamp package structure according to claim 3, wherein two opposing surfaces of the circuit board each carrying a redlight emitting diode, a green light emitting diode, and a bluelight emitting diode.

14. The light emitting diode lamp package structure according to claim 1, wherein the package body is an injection-molded transparent glue in spherical or hemispherical shape.

15. The light emitting diode lamp package structure according to claim 1, wherein the package body is in rectangular shape, said rectangle having a light emitting window, the light emitting diodes aligning with the light emitting window inside the rectangle.

16. A light emitting diode lamp assembly, comprising:
a light emitting diode lamp having a plurality of light emitting diodes and four electric conductivity supports encapsulated in a package body;
a lampshade covering the package body of the light emitting diode lamp;
a socket being a body having a perforation and extended with a plug-in member, the perforation accommodating the light emitting diodes and enabling the four electric conductivity supports to expose outside the body; and
a mount formed with a socket, the socket having four electrode contacts inside such that when the socket is plugged into the socket, the four electrode contacts being in contact with the four electric conductivity supports respectively.

17. The light emitting diode lamp assembly according to claim 16, wherein the plurality of light emitting diodes are mounted on a circuit board, the circuit board carrying a control integrated circuit, the four electric conductivity supports being respectively a positive DC voltage pad, a data input end, a data output end, and a negative DC voltage pad.

18. The light emitting diode lamp assembly according to claim 16, wherein the four electric conductivity supports have a flat shape and are flexible.

19. The light emitting diode lamp assembly according to claim 16, wherein the upper half of the socket accommodates the body, while the lower half of the body is coupled to the plug-in member.

20. The light emitting diode lamp assembly according to claim 16, wherein the socket forms a through-hole, the four electrode contacts passing through the through-hole to connect with four external wires respectively.

21. A light emitting diode lamp assembly, comprising:
a light emitting diode lamp having a package body and a circuit board, the package body encapsulating a plurality of light emitting diodes and four electric conductivity supports, the four electric conductivity supports being electrically connected to the circuit board, and the circuit board carrying a control integrated circuit and forming a positive DC voltage electrode, a data input electrode, a data output electrode and a negative DC voltage electrode;
a lampshade covering the package body of the light emitting diode lamp; and
a mount formed with a socket, the socket having four electrode contacts inside such that when the circuit board of the light emitting diode lamp is plugged into the socket, the four electrode contacts being in contact with the positive DC voltage electrode, the data input electrode, the data output electrode and the negative DC voltage electrode respectively.

22. A light emitting diode lamp assembly, comprising:
a light emitting diode lamp having a package body and a circuit board, the package body encapsulating a plurality of light emitting diodes and a control integrated circuit disposed on one side of the circuit board, a plurality of electrodes being disposed at two opposing sides of the circuit board, wherein the two opposing sides of the circuit board are respectively disposed with a data input electrode and a data output electrode;
a lampshade covering the periphery of the light emitting diode lamp; and
two mounts, each mount formed with a socket, the socket having electrode contacts inside corresponding to the electrodes of the circuit board, wherein the sockets of the two mounts are respectively coupled to the two opposing sides of the circuit board of light emitting diode lamp, and the lampshade is situated between the two mounts.

23. A package structure of the light emitting diode lamp, comprising:
a plurality of light emitting diodes, each light emitting diode having two electrode ends and one of the electrode ends being a common electrode end;
a circuit board, mounting a plurality of light emitting diodes;
a package body, encapsulating said light emitting diodes and a part of said circuit board; and
a control integrated circuit, having a data input electrode and a data output electrode and electrically connected to said light emitting diodes to control the illumination state of each light emitting diode;
wherein said circuit board being exposed outside the part of the package body carrying said control integrated circuit, and said circuit board having a first conduct electricity, a second conduct electricity, a third conduct electricity, and a fourth conduct electricity being exposed outside the package body.

24. The light emitting diode lamp package structure according to claim 23, wherein said first conduct electricity is the positive DC voltage end, said second conduct electricity connecting said data output electrode, said third conduct electricity connecting said data output electrode, and said fourth conduct electricity is the negative DC voltage end.

* * * * *